United States Patent
Jiang et al.

(10) Patent No.: US 7,851,266 B2
(45) Date of Patent: Dec. 14, 2010

(54) MICROELECTRONIC DEVICE WAFERS INCLUDING AN IN-SITU MOLDED ADHESIVE, MOLDS FOR IN-SITU MOLDING ADHESIVES ON MICROELECTRONIC DEVICE WAFERS, AND METHODS OF MOLDING ADHESIVES ON MICROELECTRONIC DEVICE WAFERS

(75) Inventors: Tongbi Jiang, Boise, ID (US); Shijian Luo, Boise, ID (US)

(73) Assignee: Micron Technologies, Inc., Boise, ID (US)

( * ) Notice: Subject to any disclaimer, the term of this patent is extended or adjusted under 35 U.S.C. 154(b) by 0 days.

(21) Appl. No.: 12/323,926

(22) Filed: Nov. 26, 2008

(65) Prior Publication Data

US 2010/0127409 A1     May 27, 2010

(51) Int. Cl.
    H01L 21/00 (2006.01)
(52) U.S. Cl. .............. 438/118; 438/106; 438/114; 438/465; 438/124; 438/127; 257/632
(58) Field of Classification Search .............. None
    See application file for complete search history.

(56) References Cited

U.S. PATENT DOCUMENTS

| | | | |
|---|---|---|---|
| 5,160,462 A * | 11/1992 | Arahara | 264/1.33 |
| 5,492,586 A | 2/1996 | Gorczyca | |
| 5,650,915 A | 7/1997 | Alfaro et al. | |
| 5,997,786 A | 12/1999 | Arthur et al. | |
| 6,184,064 B1 | 2/2001 | Jiang et al. | |
| 6,703,075 B1 | 3/2004 | Lin et al. | |
| 6,723,583 B2 * | 4/2004 | Takahashi et al. | 438/114 |
| 7,312,534 B2 | 12/2007 | delos Santos et al. | |
| 2002/0197770 A1 * | 12/2002 | Irie | 438/114 |
| 2004/0235271 A1 * | 11/2004 | Nakajyo et al. | 438/460 |
| 2005/0048693 A1 * | 3/2005 | Yoon | 438/106 |
| 2006/0102987 A1 * | 5/2006 | Saiki et al. | 257/632 |
| 2006/0189036 A1 * | 8/2006 | Clyne et al. | 438/118 |
| 2007/0126129 A1 | 6/2007 | Ahn et al. | |

OTHER PUBLICATIONS

'Adhesive' definition from dictionary.com.*
'Resin' definition from dictionary.com.*

* cited by examiner

Primary Examiner—Ha Tran T Nguyen
Assistant Examiner—Shantanu C Pathak
(74) Attorney, Agent, or Firm—Perkins Coie LLP

(57) ABSTRACT

A microelectronic device wafer includes an adhesive molded in-situ on the wafer. Adhesives and wafers are positioned in molds and a method that includes drawing in the molds at least a partial vacuum and partially curing the adhesive provides an in-situ molded adhesive that is positioned on the wafer. The adhesives can be in liquid, solid, or other forms prior to molding. During molding, the adhesive can be partially cured by heating or irradiating.

9 Claims, 8 Drawing Sheets

US 7,851,266 B2

MICROELECTRONIC DEVICE WAFERS INCLUDING AN IN-SITU MOLDED ADHESIVE, MOLDS FOR IN-SITU MOLDING ADHESIVES ON MICROELECTRONIC DEVICE WAFERS, AND METHODS OF MOLDING ADHESIVES ON MICROELECTRONIC DEVICE WAFERS

TECHNICAL FIELD

The present disclosure is related to microelectronic device wafers and manufacturing the same. In particular, the present disclosure relates to a microelectronic device wafer including an adhesive that is molded in-situ on the wafer, a mold for in-situ molding, and methods of in-situ molding an adhesive onto a microelectronic device wafer.

BACKGROUND

Adhesives are typically used to couple a microelectronic device die to a substrate and/or to couple a stack of microelectronic dies. These adhesives are conventionally applied to microelectronic devices at the wafer level via die attach adhesive films, stencil or screen printable adhesive coatings, or spin-coatable adhesive coatings. In the case of films, a solvent is used for the varnish to coat adhesive films. After coating, the solvent has to be dried. Spin-coatable materials conventionally also contain solvents that have to be dried after wafer coating. Drying solvents can raise environmental concerns and increase both the processing complexity and time required to conventionally apply an adhesive to a microelectronic device wafer.

The conventional techniques for applying adhesives at the wafer level can also be wasteful insofar as material in excess of that required to coat the wafer frequently is cast off or must be removed. This waste also increases the processing complexity and time required to conventionally apply an adhesive to a microelectronic device wafer. Moreover, uneven coating thickness also can result from the conventional applications for applying adhesives to a microelectronic device wafer.

DETAILED DESCRIPTION

Specific details of several embodiments of the disclosure are described below with reference to microelectronic device wafers and methods for manufacturing such wafers. The microelectronic devices can include, for example, micromechanical components, data storage elements, optics, read/write components, or other features. The microelectronic dies can be flash memory (e.g., NAND flash memory), SRAM, DRAM (e.g., DDR-SDRAM), processors, imagers, and other types of devices. Other embodiments of the disclosure can have configurations, components, features or procedures different than those described in this section. A person of ordinary skill in the art, therefore, will accordingly understand that the disclosure may have other embodiments with additional elements, or the disclosure may have other embodiments without several of the elements shown and described below with reference to FIGS. 1 to 8.

Figure 1:
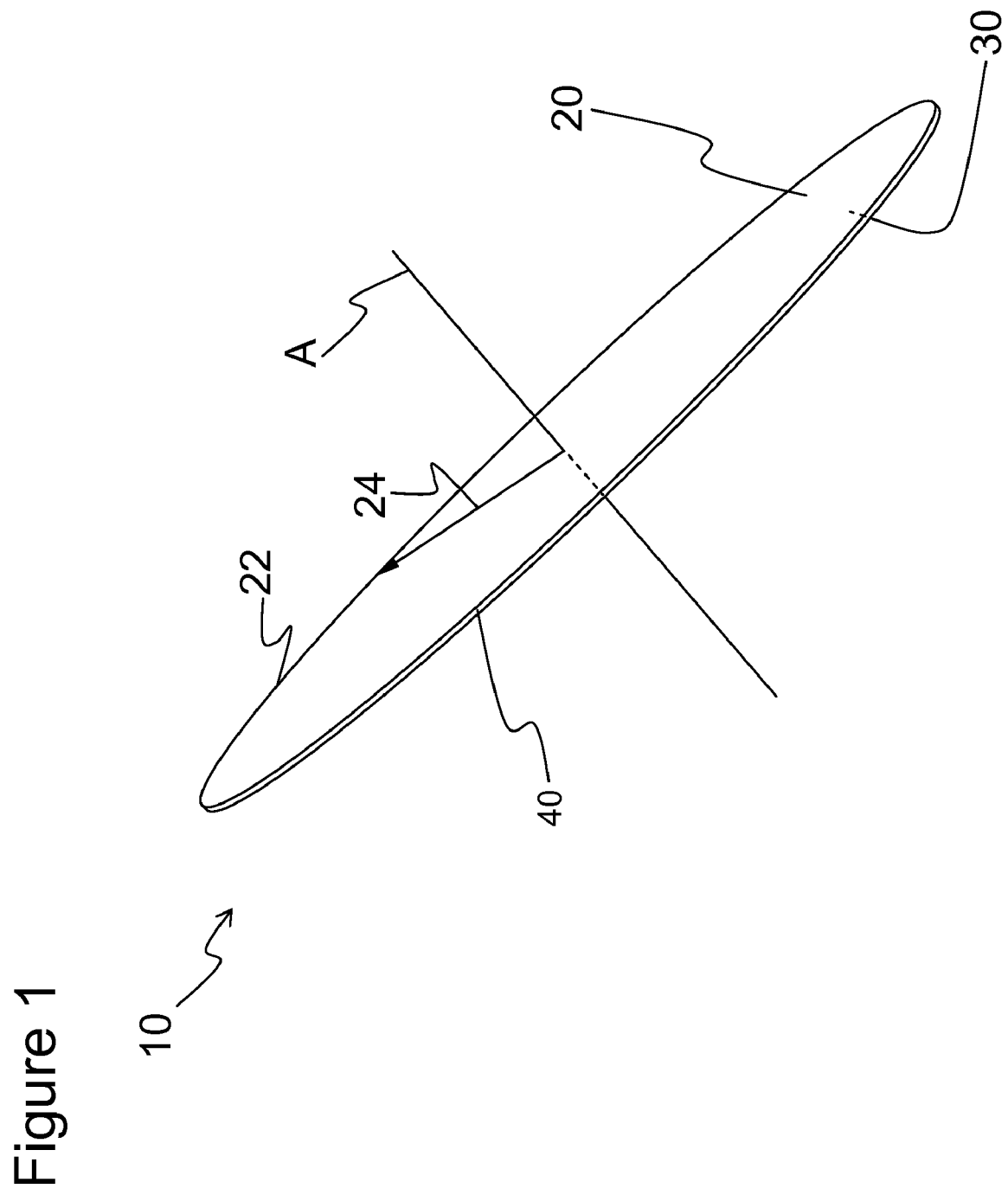
FIG. 1 is a schematic perspective view of a wafer in accordance with embodiments of the present disclosure.

FIG. 1 is a schematic perspective view of a wafer 10 in accordance with embodiments of the present disclosure. The wafer 10 can include a first face 20, a second face 30 spaced from the first face 20 along an axis A, and an edge 40 adjoining the first and second faces 20 and 30. In the embodiment shown in FIG. 1, the first face 20 is approximately circular with a perimeter 22 defined by a first radius 24 from the axis A. The second face 30 can be approximately parallel to the first face 20. According to other embodiments, the first and second faces 20 and 30 can have any regular or irregular shape and can be obliquely oriented with respect to one another, and/or the edge 40 can have any suitable contour and can be oriented in a regular or skewed relationship with respect to the first and/or second faces 20 and 30.

The first face 20 can be, for example, a back side or passive side of the wafer 10, and the second face 30 can be, for example, a front side or active side of the wafer 10 where the dies are fabricated. The wafer 10 typically includes single crystalline silicon but can include any suitable wafer material. The wafer 10 can have a regular thickness, e.g., measured parallel to the axis A between the first and second faces 20 and 30, or can be thinned according to any suitable technique. In the embodiment shown in FIG. 1, the wafer 10 is not singulated such that a plurality of individual dies (not shown) is at the second face 30 of the wafer 10.

Figure 2:
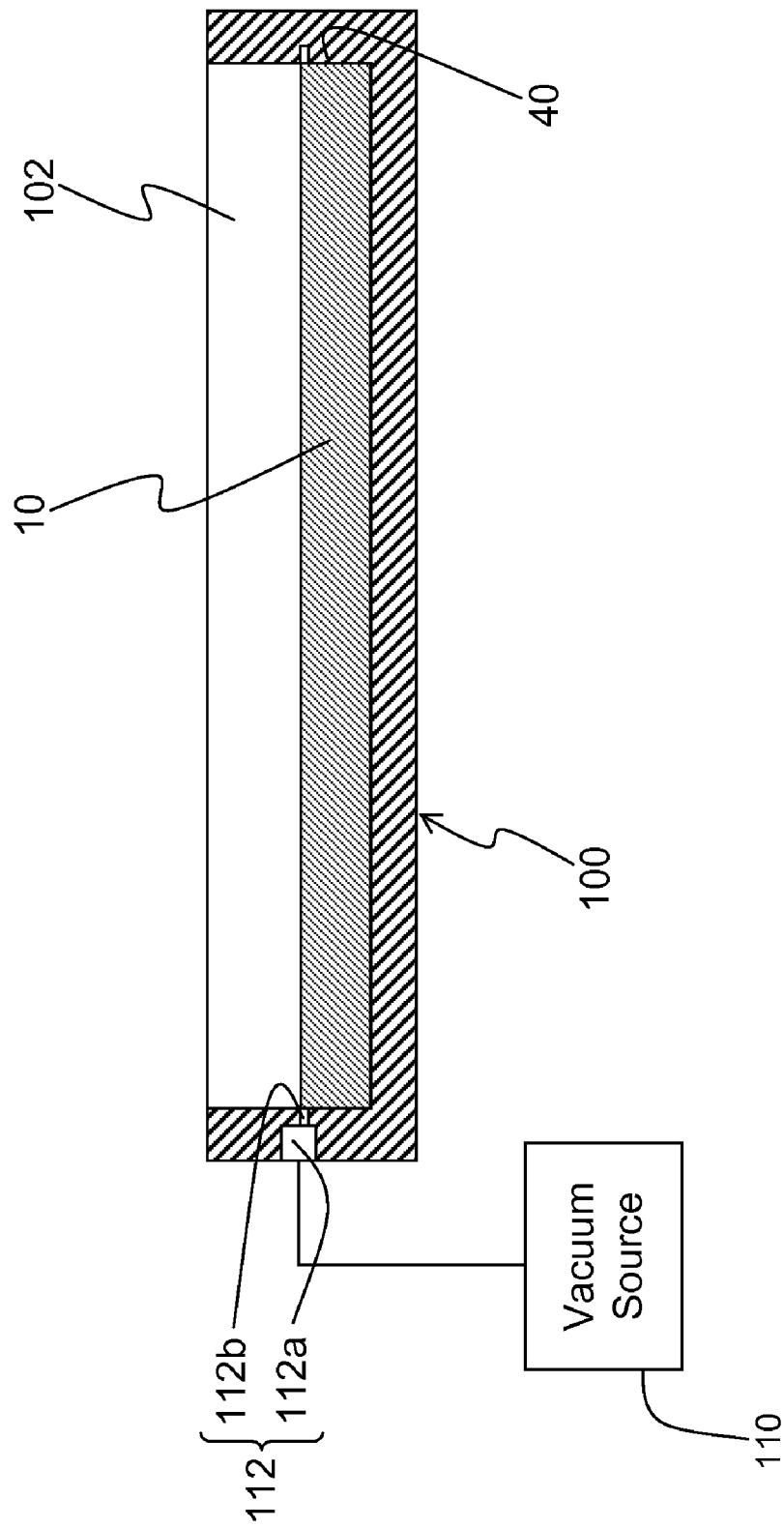
FIG. 2 is a schematic cross-section view showing the wafer of FIG. 1 positioned in an opened mold in accordance with embodiments of the present disclosure.

FIG. 2 is a schematic cross-section view showing a stage of a method for applying an adhesive to the wafer 10 using a mold 100 in accordance with embodiments of the present disclosure. As shown in FIG. 2, an opened configuration of the mold 100 provides access to a cavity 102 that approximately conforms to the edge 40 of the wafer 10. In the embodiment shown in FIG. 2, the cavity 102 has a right-cylindrical shape that is sized with respect to the wafer 10 so as to allow the wafer 10 to be freely positioned into and removed from the mold 100. The cavity 102 is also sized so as to avoid or prevent an adhesive from being displaced between the edge 40 and the mold 100.

A vacuum source 110 is coupled with the cavity 102 via a passage system 112. In the embodiment shown in FIG. 2, the passage system 112 includes a port 112a coupled with a vent ring 112b that is positioned around the mold 100. Accordingly, the vacuum source 110 is in fluid communication with the cavity 102 via the passage system 112. In other embodiments, one or more discrete openings (not shown) in lieu of the vent ring 112b can be coupled to the port 112a.

Figure 3:
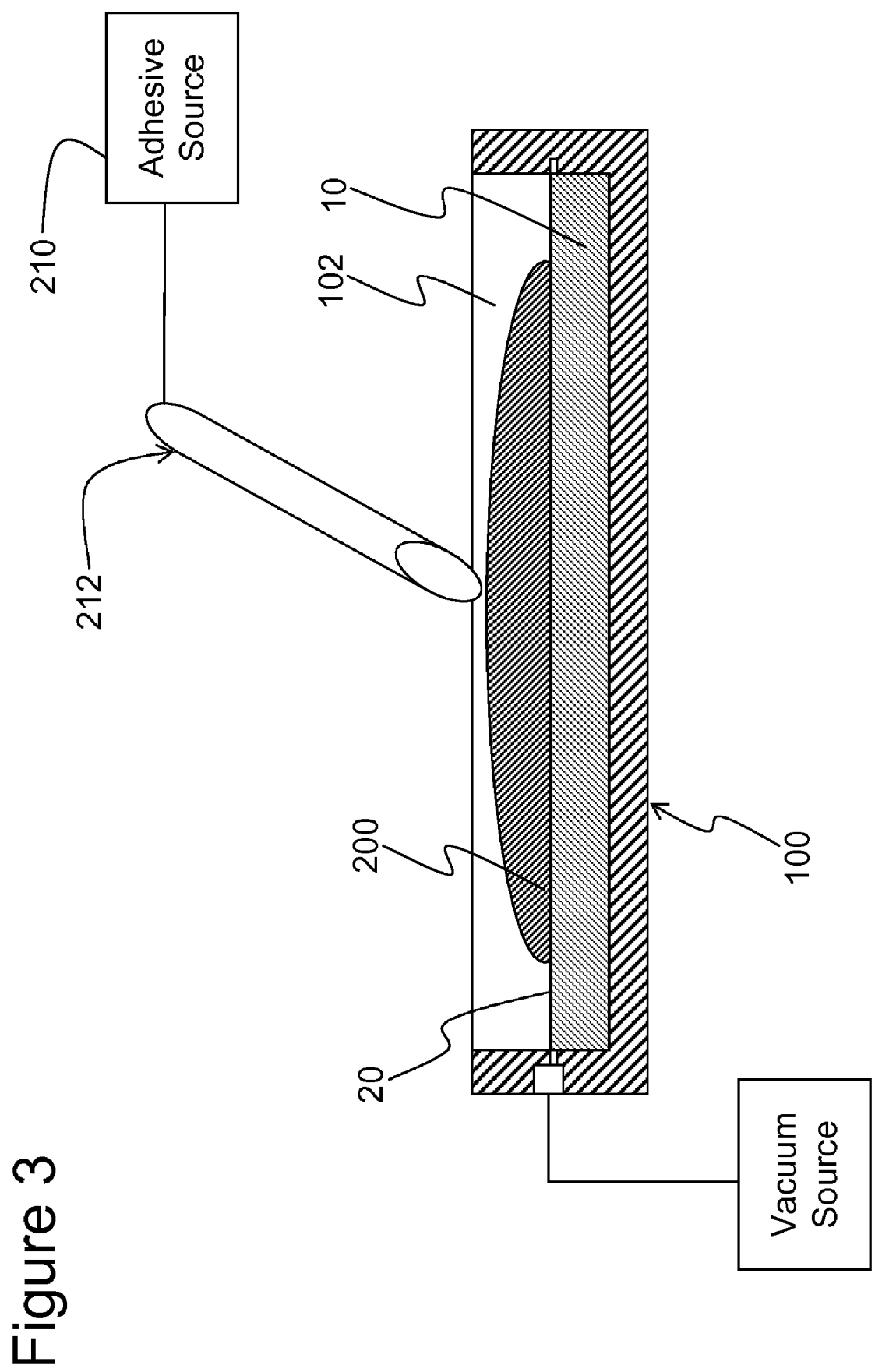
FIG. 3 is a schematic cross-section view showing adhesive dispensed in accordance with embodiments of the present disclosure on the wafer in the mold of FIG. 2.

FIG. 3 is a schematic cross-section view showing a subsequent stage of the method in which an adhesive 200 is dispensed onto the wafer 10 in the mold 100 in accordance with embodiments of the present disclosure. The adhesive 200 can be dispensed from an adhesive source 210 via a conduit system 212. As shown in FIG. 3, the conduit system 212 dispenses the adhesive 200 with the mold 100 in the opened configuration. In other embodiments, the adhesive 200 can be injected into the cavity 102 with the mold 100 in a closed configuration (not shown), or by any suitable dispensing technique. The adhesive 200 is dispensed onto only one face surface, e.g., the first face 20 as shown in FIG. 3.

The volume and/or mass of adhesive 200 are precisely metered so that the thickness of the adhesive layer can be accurately controlled. In the embodiment shown in FIG. 3, the volume can be determined based on the area of the first face 20 and the target thickness of the adhesive 200 on the first face 20 of the wafer 10. Accordingly, only the amount of adhesive 200 that is needed to cover only one side of the wafer 10 at the target thickness is dispensed from the adhesive source 200. This enables good control of the target thickness with little or no waste according to the present disclosure.

The adhesive 200 can have different forms including a liquid adhesive, a solid adhesive, e.g., powder, or any suitable form that can be dispensed. In the case of a liquid, the adhesive 200 can flow onto the wafer 10 via the conduit system 212. In the case of a solid, the adhesive 200 can be deposited on the wafer 10 by any suitable technique via the conduit system 212. In accordance with the present disclosure, the adhesive 200 is solvent free to be more environmentally friendly and can include a high filler loading to reduce or eliminate warpage of the wafer 10 and/or the individual dies (not shown).

According to embodiments of the present invention, the adhesive 200 can have a dual cure system. For example, an acrylic resin can be cured during molding with a free radical initiator such as benzyl peroxide at a low temperature (e.g., below approximately 100 degrees Celsius), and an epoxy resin can be subsequently cured with a hardener such as acid anhydride and a catalyst such as imidazole and its derivatives at a relatively higher temperature (e.g., above approximately 150 degrees Celsius). In other embodiments, providing ultraviolet radiation during molding can be used to cure an acrylic resin including an ultraviolet initiator such as triphenylsulfonium salts with non-nucleophilic anions at room temperature, and an epoxy resin can be subsequently cured with a hardener such as acid anhydride and a catalyst such as imidazole and its derivatives at a temperature of approximately 150 degrees Celsius. In still other embodiments, the adhesive can include a high molecular epoxy resin, its hardener, a catalyst, and any suitable additives. Such a mixture is a powdered or fine particle solid at room temperature. At a molding temperature (e.g., approximately 100 degrees Celsius), the mixture can soften and be molded, and there can be a minimum curing reaction. The epoxy curing reaction can subsequently take place at a relatively higher temperature (e.g., above approximately 150 degrees Celsius). The epoxy curing reaction can be determined by the hardener, such as an anhydride, and the catalyst, such as imidazole and its derivatives.

Figure 4:
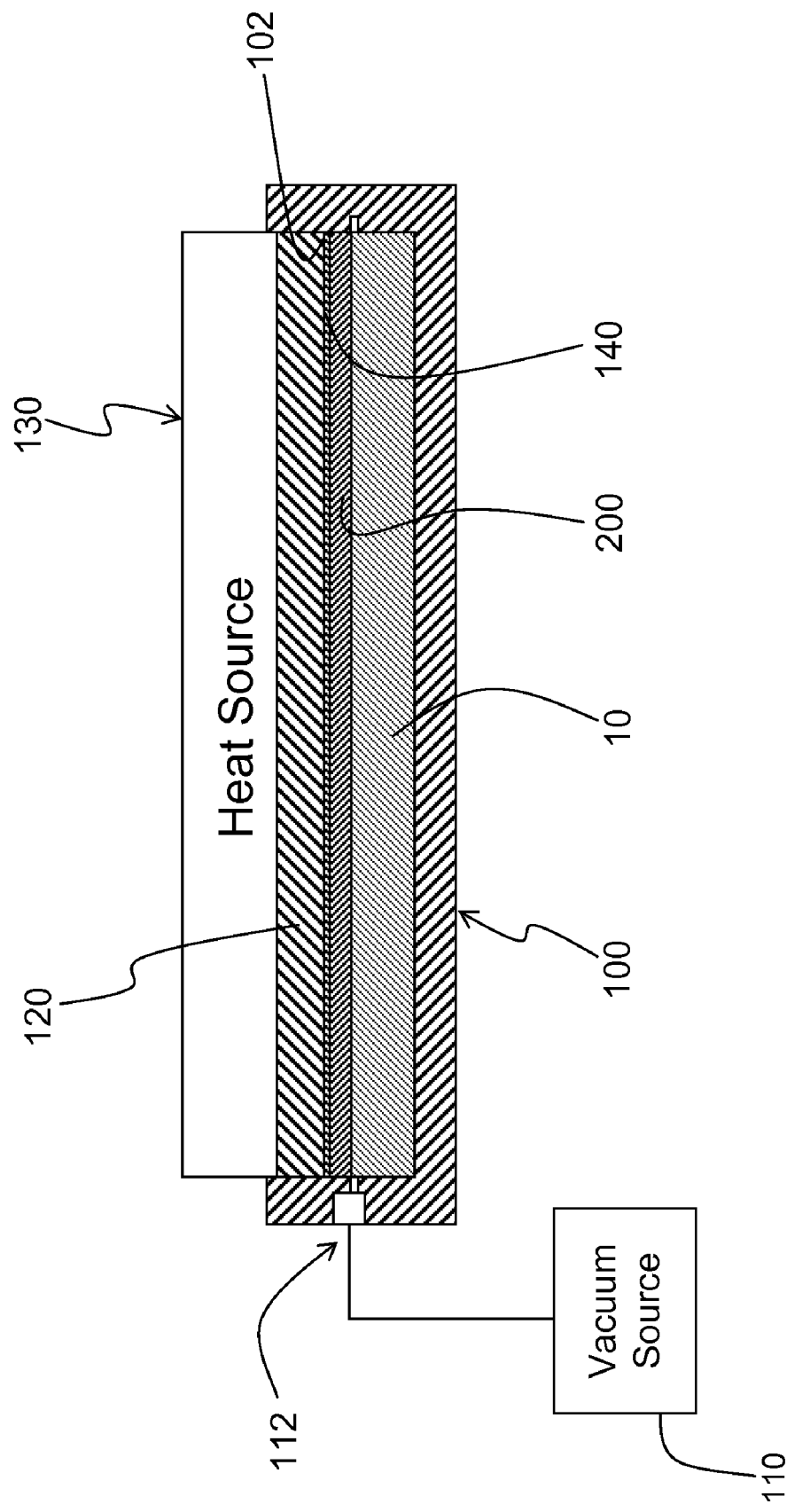
FIG. 4 is a schematic cross-section view showing a closed mold in accordance with embodiments of the present disclosure.

FIG. 4 is a schematic cross-section view showing a subsequent stage of the method in which a plate 120 approximately occludes the cavity 102 in a closed configuration of the mold 100. In the embodiment shown in FIG. 4, the plate 120 is sized so as to avoid or prevent the adhesive 200 from being displaced between the mold 100 and the plate 120. The plate 120 can exert a downward force, e.g., by gravity or an active force, against the adhesive 200 to distribute the adhesive 200 across the first face 20 of the wafer 10. The plate 120 can be a thermally conductive material or transparent to electromagnetic energy (e.g., microwave or infrared).

A heat source 130 is positioned with respect to the mold 100 so as to increase the temperature of the adhesive 200. In the embodiment shown in FIG. 4, the heat source 130 can be coupled to the plate 120 such that heat from the heat source 130 is conducted via the plate 120 to the adhesive 200. Alternatively, the heat source 130 can include an electromagnetic wave generator, e.g., an infrared generator, and the plate 120 can be transparent to the generated electromagnetic radiation. The adhesive 200 can accordingly be directly heated by the electromagnetic radiation. In other embodiments according to the present disclosure, the heat source 130 can be arranged with respect to any suitable portion of the mold 100 and any suitable source of heat can be used that increases the temperature of the adhesive 200.

According to embodiments of the present disclosure, the vacuum source 110 and the heat source 130 can be activated concurrently. In the closed configuration of the mold 100, the vacuum source 110 can draw at least a partial vacuum in the cavity 102 via the passage system 112, and the heat source 130 can increase the temperature of the adhesive 200 in the cavity 102. Other embodiments in accordance with the present disclosure can sequentially or alternately activate the vacuum and heat sources 110 and 130.

The combination of drawing at least a partial vacuum and increasing the temperature to a first level in the cavity 102 molds in-situ the adhesive 200 on the wafer 10. Accordingly, the first temperature level is sufficient to attach the adhesive 200 to the wafer 10 without fully curing or activating the adhesive 200. For example, in the case that the pre-molded adhesive 200 is in a liquid form, in-situ molding of the adhesive 200 on the wafer 10 at the first temperature level can include partially curing, e.g., B-staging, the adhesive 200. The term "B-staging" can refer to a process that includes converting adhesive in a liquid form to a solid or semi-solid form that is not hardened or fully cured. Ultraviolet radiation can also be used to partially cure the adhesive 200. According to embodiments of the present invention, the ultraviolet radiation can be generated by an ultraviolet lamp (not shown) that is in addition to or in lieu of the heat source 130. Accordingly, the plate 120 can be transparent to the ultraviolet radiation. In other embodiments according to the present disclosure, any suitable source of electromagnetic radiation that partially cures the adhesive 200 can be arranged with respect to any suitable portion of the mold 100. In some embodiments according to the present invention, partially curing the adhesive 200 with electromagnetic radiation can occur while the adhesive 200 is at ambient temperature, e.g., at room temperature. In the case that the pre-molded adhesive 200 is in a solid form (e.g., a powder or fine particle material), the in-situ molding can include melting the adhesive 200 on the wafer 10 at the first temperature level. Melting the solid form of the adhesive 200 allows the adhesive to spread across the first face 20 and become approximately uniformly distributed on the wafer 10. Partially curing is optional during in-situ molding if the pre-molded adhesive 200 is in a solid form. Following the in-situ molding, the adhesive molded on the wafer can be cooled to a second temperature level and removed from the mold 100. The second temperature level, which is lower than the first temperature level, typically reduces the tackiness.

In the embodiment shown in FIG. 4, a film 140 can be positioned between the plate 120 and the pre-molded adhesive 200. The film 140 can assist in molding the adhesive by easing release of the plate 120 following the in-situ molding. In other embodiments according to the present invention, the film can be positioned in any suitable location, e.g., between the wafer 10 and the mold 100, to ease releasing the wafer with the adhesive layer from the mold 100.

Methods of in-situ molding an adhesive onto a wafer according to several embodiments of the present disclosure enable the use of a precise amount of solvent-free adhesive to cover only one face of a wafer. Accordingly, little or no adhesive is wasted and, as compared to solvent-based adhesives, potentially adverse environmental impacts are reduced or eliminated. Additionally, the target thickness of the adhesive is applied uniformly over the face of the wafer. According to other embodiments of the present disclosure, different forms of adhesives, e.g., liquids or powders, different types of heat sources, and different heating routines enable flexibility in molding and curing the adhesive on a wafer. Die attach adhesives with higher filler loading can be molded onto a wafer according to still other embodiments of the present disclosure. The higher filler loading can reduce adhesive shrinkage and can thereby reduce wafer and/or die warpage in connection with, for example, face-to-face flip chip die stacks. According to embodiments of the present invention, examples of suitable filler materials can include silica, aluminum trihydroxide, aluminum borate, calcium borate, calcium carbonate, lanthanum borite ($LaB_6$), indium tin oxide, carbon black, and/or any suitable material in a particle or particulate form.

Figure 5:
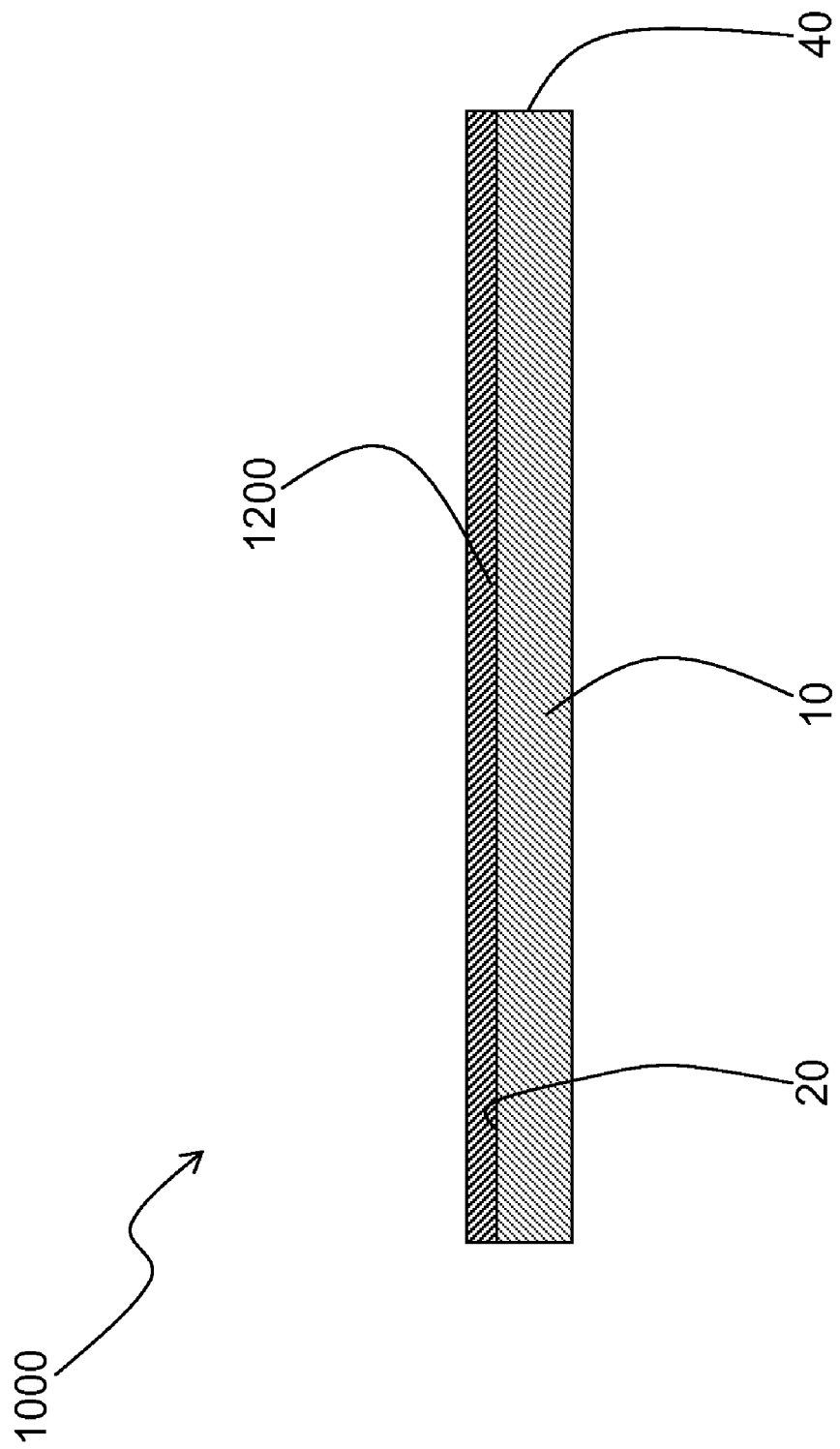
FIG. 5 is a schematic cross-section view showing an adhesive molded wafer in accordance with embodiments of the present disclosure.

FIG. 5 is a schematic cross-section view showing a wafer 1000 including a molded adhesive 1200 in accordance with embodiments of the present disclosure. More specifically, the wafer 1000 includes the molded adhesive 1200 positioned on the first face 20 of the wafer 10 and extending outwardly only to the edge 40 of the wafer 10. Accordingly, the entire first face 20 is covered with an approximately uniform thickness of the molded adhesive 1200 and little or none of the pre-molded adhesive has been lost or wasted.

Figure 6:
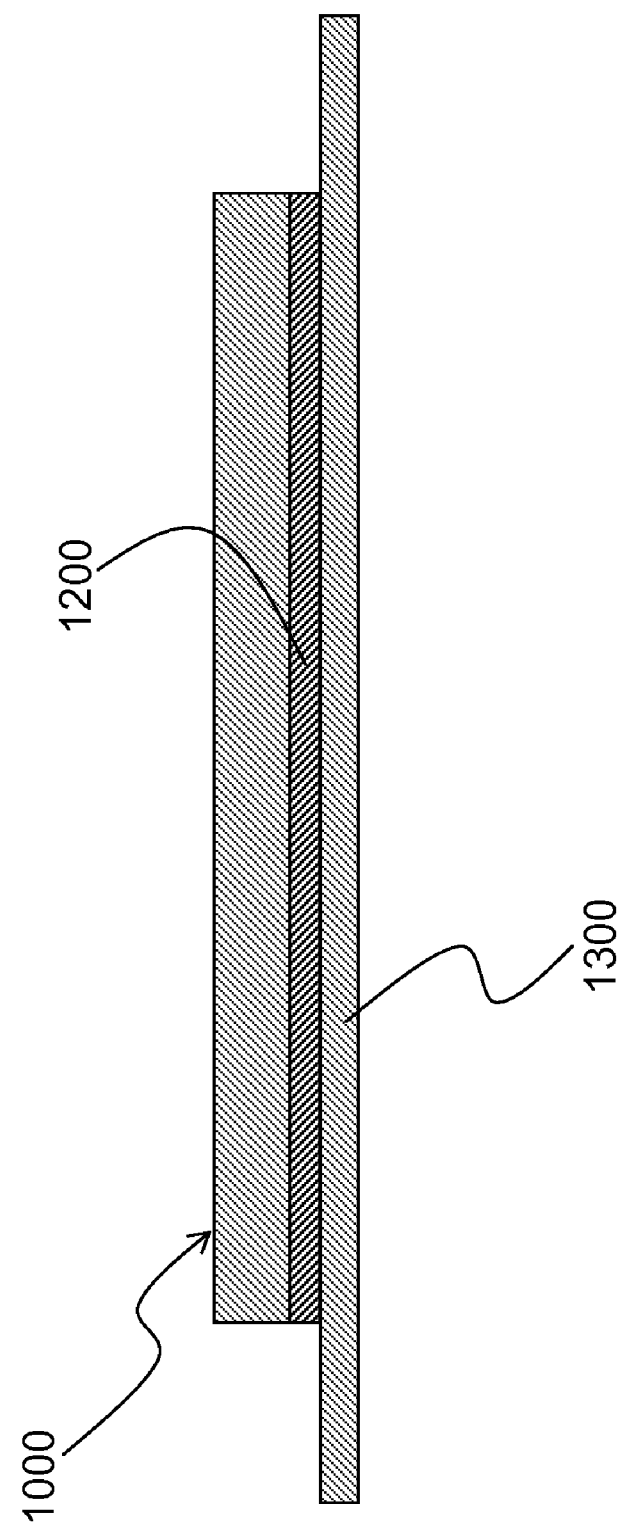
FIG. 6 is a schematic cross-section view showing the adhesive molded wafer of FIG. 5 mounted on dicing film in accordance with embodiments of the present disclosure.

FIG. 6 is a schematic cross-section view showing the wafer 1000 including the molded adhesive 1200 mounted on dicing film 1300 in accordance with embodiments of the present disclosure. In the embodiment shown in FIG. 6, the wafer 1000 can be flipped over and the molded adhesive 1200 mounted on the dicing film 1300. In other embodiments, the dicing film 1300 can be mounted on the molded adhesive 1200 included on the wafer 1000 and then the combination can be flipped over as necessary for subsequent processing. Any suitable technique can be used for coupling the dicing film 1300 and the wafer 1000 including the molded adhesive 1200.

Figure 7:
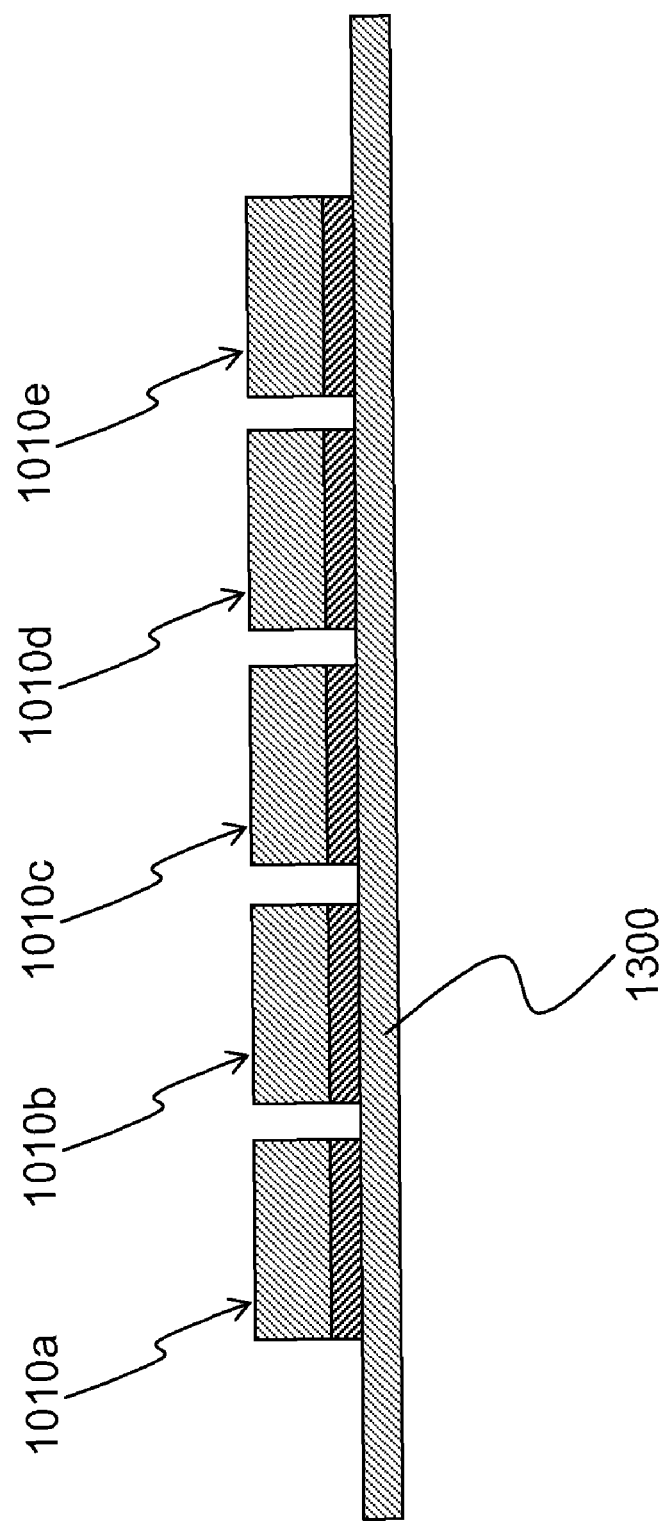
FIG. 7 is a schematic cross-section view showing the adhesive molded wafer of FIG. 6 singulated in accordance with embodiments of the present disclosure.

FIG. 7 is a schematic cross-section view showing the adhesive molded wafer 1000 singulated in accordance with embodiments of the present disclosure. In accordance with any typical technique, e.g., wafer sawing, the adhesive molded wafer 1000 can be singulated into portions 1010 (e.g., individual portions 1010a to 1010e are shown in FIG. 7) that can each include an individual die (not shown). The singulated wafer portions 1010 can be separated from the dicing film 1300 by any suitable technique for subsequent processing.

Figure 8:
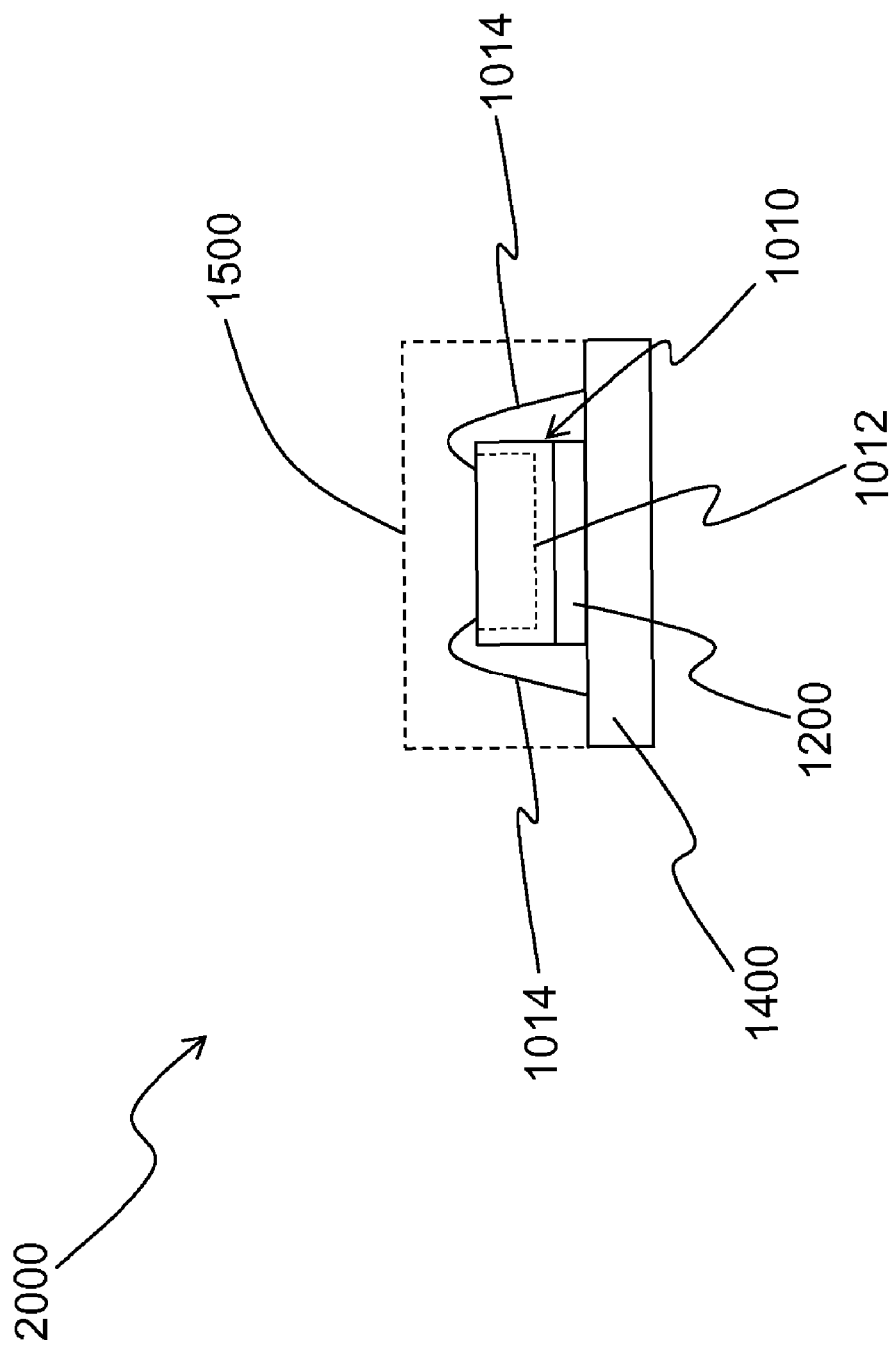
FIG. 8 is a schematic elevation view showing a microelectronic device including a singulated wafer portion adhesively coupled to a substrate in accordance with embodiments of the present disclosure.

FIG. 8 is a schematic elevation view showing a microelectronic device 2000 including a singulated wafer portion 1010 adhesively coupled to a substrate 1400 in accordance with embodiments of the present disclosure. The wafer portion 1010 can be adhesively coupled to the substrate 1400 by heating the wafer portion 1010 to a third temperature level that changes the molded adhesive 1200 to a tacky state. Accordingly, the molded adhesive 1200 can adhere the wafer portion 1010 to the substrate 1400. The third temperature level is greater than the second temperature level, but may be less than, equal to, or greater than the first temperature level. In other embodiments according to the present disclosure, the substrate 1400 can include another singulated wafer portion, a die, a stack of dies, or any combination thereof.

According to the embodiment of the present disclosure shown in FIG. 8, the microelectronic device 2000 can include an individual die 1012 electrically coupled to the substrate 1400 by electrical connectors 1014 (e.g., wire bonds). The microelectronic device 2000 can be packaged in an encapsulant 1500 and heated to a fourth temperature level to fully cure the molded adhesive 1200. The fourth temperature level can be at least as great as the first temperature level. In other embodiments according to the present disclosure, the molded adhesive 1200 can be heated to the fourth temperature level to fully cure the molded adhesive 1200 separately from encapsulating the microelectronic device 2000. In still other embodiments according to the present disclosure, the molded adhesive 1200 can be fully cured by a different thermal treatment, e.g., heating at a lower temperature for a longer period, by ultraviolet radiation, by microwave radiation, or by any suitable curing technique.

From the foregoing, it will be appreciated that specific embodiments of the disclosure have been described herein for purposes of illustration, but that various modifications may be made without deviating from the spirit and scope of the disclosure. For example, structures and/or processes described in the context of particular embodiments may be combined or eliminated in other embodiments. In particular, the attachment features described above with reference to particular embodiments can include one or more additional features or components, or one or more of the features described above can be omitted. Moreover, while advantages associated with certain embodiments of the disclosure have been described in the context of these embodiments, other embodiments may also exhibit such advantages, and not all embodiments need necessarily exhibit such advantages to fall within the scope of the disclosure. Accordingly, embodiments of the disclosure are not limited except as by the appended claims.

We claim:

1. A method of molding a liquid adhesive onto a microelectronic device wafer, comprising:
    positioning the wafer in a mold cavity, the wafer includes a first face, a second face, an edge between the first and second faces, and a plurality of semiconductor dies with integrated circuits at the second face;
    flowing a predetermined volume of the liquid adhesive onto only the first face of the wafer in the mold cavity, the predetermined volume of the liquid adhesive being determined based on an area of the first face and a target adhesive thickness;
    exerting a force against the liquid adhesive so as to mold an adhesive layer onto the wafer;
    heating the adhesive layer to a first temperature;
    cooling the adhesive layer to a second temperature lower than the first temperature;
    removing the wafer with the adhesive layer from the mold cavity;
    singulating the wafer with the adhesive layer into a plurality of wafer portions, individual wafer portions including a die; and
    adhering an individual wafer portion to a substrate, the adhering includes heating the wafer portion to a third temperature greater than the second temperature.

2. The method of claim 1, wherein exerting the force comprises positioning a plate over the adhesive flowed onto the wafer and drawing a partial vacuum in the mold cavity.

3. The method of claim 1, further comprising:
    packaging the individual wafer portion, the packaging includes— encapsulating the wafer portion; and heating the wafer portion to a fourth temperature to cure the adhesive, the fourth temperature being greater than the first temperature.

4. The method of claim 1, further comprising mounting onto dicing film the wafer with the adhesive layer.

5. A method of molding a powder adhesive onto a microelectronic device wafer, comprising:

positioning the wafer in a mold cavity, the wafer includes a first face, a second face, an edge between the first and second faces, and a plurality of semiconductor dies with integrated circuits at the second face;

depositing a predetermined volume of the adhesive onto only the first face of the wafer in the mold cavity, the predetermined volume of the adhesive being determined based on an area of the first face and a target adhesive thickness;

heating the adhesive to a first temperature to melt the adhesive so as to mold an adhesive layer onto the wafer;

removing the wafer with the adhesive layer from the mold cavity, the removing occurring at a second temperature no greater than the first temperature;

singulating the wafer with the adhesive layer into a plurality of wafer portions, individual wafer portions including a die; and adhering an individual wafer portion to a substrate, the adhering including heating the individual wafer portion to a third temperature greater than the second temperature.

6. The method of claim 5, wherein heating the adhesive comprises partially curing the adhesive.

7. The method of claim 5, further comprising cooling the adhesive layer from the first temperature to the second temperature.

8. The method of claim 5, further comprising drawing a plate against the powder adhesive via a partial vacuum in the mold cavity while heating the adhesive.

9. The method of claim 5, further comprising:

packaging the individual wafer portion, the packaging includes— encapsulating the individual wafer portion; and heating the individual wafer portion to a fourth temperature to cure the adhesive, the fourth temperature being greater than the first temperature.

* * * * *